(12) United States Patent
Hirayanagi

(10) Patent No.: US 6,841,402 B1
(45) Date of Patent: Jan. 11, 2005

(54) ALIGNMENT-MARK DETECTION METHODS AND DEVICES FOR CHARGED-PARTICLE-BEAM MICROLITHOGRAPHY, AND MICROELECTRONIC-DEVICE MANUFACTURING METHODS COMPRISING SAME

(75) Inventor: Noriyuki Hirayanagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 153 days.

(21) Appl. No.: 09/659,211

(22) Filed: Sep. 11, 2000

(30) Foreign Application Priority Data

Sep. 10, 1999 (JP) .......................................... 11-257003

(51) Int. Cl.[7] .............................................. H01L 21/66
(52) U.S. Cl. .......................... 438/14; 438/16; 438/725; 438/975; 250/492.22
(58) Field of Search ............................. 438/725, 7, 10, 438/14, 16, 17, 975, 680; 250/492.22, 492.3

(56) References Cited

U.S. PATENT DOCUMENTS 4,808,829 A * 2/1989 Okumura et al. ......... 250/491.1
4,977,328 A * 12/1990 Van Vucht ................ 250/491.1
6,166,380 A * 12/2000 Kitagawa et al. ........... 250/307
2002/0079462 A1 * 6/2002 Amemiya et al. ......... 20/491.1

OTHER PUBLICATIONS

Reimer, *Transmission Electron Microscopy: Physics of Image Formation and Microanalysis*, §9.3:392–420. Springer–Verlag, 1984.

* cited by examiner

Primary Examiner—Caridad Everhart
(74) Attorney, Agent, or Firm—Klarquist Sparkman, LLP

(57) ABSTRACT

Methods and devices are provided that achieve accurate detection of the positions of alignment marks on wafer substrates and other specimens as used in charged-particle-beam (CPB) microlithography. A charged particle beam (e.g., electron beam) is irradiated onto an area, of a specimen, lacking an alignment mark to obtain a first backscattered-particle signal regarded as "background." The beam is irradiated onto an area, of the specimen, where an alignment mark is present to obtain a second backscattered-particle signal. The difference of the first signal from the second signal is determined to produce a difference signal containing data concerning only aspects of the alignment mark and not of the background. The methods are especially useful whenever the specimen has crystalline properties that otherwise could affect the backscattered-particle signal.

10 Claims, 5 Drawing Sheets

Lithography Step

US 6,841,402 B1

ALIGNMENT-MARK DETECTION METHODS AND DEVICES FOR CHARGED-PARTICLE-BEAM MICROLITHOGRAPHY, AND MICROELECTRONIC-DEVICE MANUFACTURING METHODS COMPRISING SAME

FIELD OF THE INVENTION

This invention pertains to microlithography (projection-transfer of a pattern, defined on a reticle, to a suitable substrate). Microlithography is a key technology used in the manufacture of microelectronic devices such as integrated circuits, displays, and the like. More specifically, this invention pertains to aligning the reticle and substrate for accurate pattern transfer.

BACKGROUND OF THE INVENTION

In charged-particle-beam (CPB) microlithography (i.e., microlithography performed using a charged particle beam such as an electron beam or ion beam), as in optical microlithography (i.e., microlithography performed using visible or ultraviolet light), obtaining accurate alignment between the reticle and the substrate is extremely important. Current microlithography apparatus include sophisticated devices for determining reticle-substrate alignment. In a CPB microlithography apparatus as currently available, these alignments involve impinging a charged particle beam on a mark on the substrate or substrate stage and detecting charged particles (e.g., electrons) backscattered from the mark.

A conventional method and apparatus for detecting an alignment mark in CPB microlithography are shown in FIGS. 3(A)–3(C). FIG. 3(A) shows certain aspects of such an apparatus employing an electron beam EB; FIG. 3(B) depicts certain details of scanning an alignment mark on the substrate (wafer) using the electron beam EB; and FIG. 3(C) shows a typical backscattered-electron (BSE) signal waveform obtained by scanning the alignment mark in FIG. 3(B).

The apparatus of FIG. 3(A) includes an electron-beam source (electron gun) 1 that produces an electron beam EB propagating downstream of the electron gun 1. The electron beam EB passes through an electron-optical system OS and irradiates a silicon wafer or other suitable specimen 7. The wafer 7 is mounted on a wafer stage 5. The wafer stage 5 is movable to allow exposure of the entire wafer 7 and to allow loading and unloading of the wafer 7 for exposure.

The electron beam EB propagating toward the wafer 7 is deflected by a scanning deflector 3 located downstream of the electron-optical system OS. The scanning deflector 3 is connected to a deflector controller 4. The scanning deflector 3 is controlled by the controller 4, which thus causes the electron beam EB to be scanned over the wafer 7 in two dimensions.

Whenever the electron beam EB irradiates the wafer 7 in this manner, backscattered electrons are generated and propagate in an upstream direction from the upstream-facing surface of the wafer 7. The backscattered electrons are detected by a BSE detector 9. As the BSE detector 9 receives backscattered electrons, it produces a corresponding electrical "BSE signal" that is routed to a controller 10 via an interface 8. The interface 8 comprises an amplifier and an analog-to-digital (A/D) converter that convert the BSE signal from the BSE detector 9 into input data usable by the controller 10. The controller 10 comprises an arithmetic processor that calculates a position of the alignment mark 7a based on the input data. Thus, as the electron beam EB is scanned across the mark 7a on the wafer 7, changes in the BSE signal are monitored.

Before the electron beam EB is incident on the wafer 7, the transverse profile of the beam is shaped by passage of the beam through a beam-shaping aperture (not shown) situated within the electron-optical system OS. Passage of the beam through the beam-shaping aperture trims the periphery of the beam to a desired size and shape before the beam is scanned over the alignment mark 7a. An exemplary alignment mark 7a is shown in FIG. 3(B), in which elements of the alignment mark 7a are defined by corresponding channels 7b etched into the surface of the wafer 7. Ideally, whenever the electron beam EB scans the alignment mark 7a, the resulting BSE signal exhibits a distinctive waveform that corresponds to the elevational profile of the alignment mark 7a, as shown in FIG. 3(C). Due to the distinctiveness of the waveform formed by passing the beam over the mark 7a, it is possible to detect the position of the alignment mark 7a from the obtained BSE signal waveform.

As an alternative to defining elements of the alignment mark 7a by etched channels in the wafer surface, the elements of the alignment mark can be defined by forming corresponding regions of a patterned layer of a heavy metal (e.g., Ta or W) on the wafer surface. Regions of the layer of heavy metal exhibit a high level of electron backscattering relative to the wafer material.

In the apparatus of FIG. 3(A), whenever the specimen 7 is a silicon wafer having well-defined crystal properties, the BSE signal waveform that is obtained includes components derived from the alignment mark 7a and from the crystal properties of the specimen 7 itself. These signals are detected simultaneously, and thus both contribute substantially to the BSE signal waveform.

For example, if the electron beam incident on a crystalline silicon wafer 7 has an energy of approximately 100 keV, then changes in signal amplitude originating from the crystalline properties of the wafer material will be nearly equal to changes in the amplitude of the BSE signal from an alignment mark formed by channels in the wafer surface. The resulting lack of differentiation in the BSE signal produced by the alignment mark versus by the wafer surface causes a significant reduction in the accuracy with which the position of the alignment mark can be detected.

SUMMARY OF THE INVENTION

In view of the shortcomings of the prior art as summarized above, an object of the invention is to provide methods and apparatus that achieve more accurate detection of alignment-mark positions for charged-particle-beam (CPB) microlithography.

To such end, and according to a first aspect of the invention, methods are provided for detecting, in the context of charged-particle-beam (CPB) microlithography of a specimen, a position of an alignment mark on the specimen. In a representative embodiment of such a method, a charged particle beam (e.g., electron beam or ion beam) is irradiated onto an area of the specimen lacking an alignment mark. Backscattered charged particles propagating from the irradiated area are detected so as to obtain a first backscattered-particle signal. The first backscattered-particle signal can serve as a "background" signal. The charged particle beam also is irradiated onto the alignment mark. Backscattered charged particles propagating from the irradiated alignment mark are detected so as to obtain a second backscattered-particle signal. The first backscattered-particle signal is subtracted from the second backscattered-particle signal to obtain a difference signal. The alignment-mark position is determined from the difference signal.

In this method, the background signal can be obtained by scanning the charged particle beam across a smooth planar region of a surface of the specimen. In a specimen made of a material (e.g., monocrystalline silicon) having a crystal-orientation plane, the first backscattered-particle signal can be obtained by scanning the charged particle beam across a smooth planar region of a surface of the specimen representing a crystal-orientation plane of the specimen. The subtraction of the first backscattered-particle signal from the second backscattered-particle signal removes data, concerning the crystal-orientation of the specimen, from the difference signal that otherwise would obfuscate data in the difference signal pertaining to the alignment mark. I.e., the difference signal in such an instance contains data regarding the configuration and other aspects of the alignment mark but not data concerning the crystal orientation of the specimen.

If the specimen is monocrystalline, then a background signal will be the same from any smooth planar region of the specimen surface, and hence can be obtained conveniently from any such smooth planar region of the specimen surface. Data in the background signal can be stored for later recall when it is desired to remove the "noise" represented in the background signal from an alignment-mark detection signal. In addition, the amplitude of a backscattered-particle signal from a monocrystalline surface varies with changes in the angle of incidence of the beam on the surface. Subtracting the background signal removes this effect from the difference signal.

According to another aspect of the invention, devices are provided for measuring an alignment of the substrate (in the context of a CPB microlithography apparatus including a CPB source that produces a charged particle beam, a CPB-optical system through which the charged particle beam passes from the CPB source to a substrate, and a substrate stage on which the substrate is placed for exposure by the charged particle beam). A representative embodiment of the device includes a deflector situated and configured to deflect the charged particle beam to cause the beam to irradiate a predetermined location on the substrate mounted on the substrate stage, so as to cause the location to produce backscattered particles. The device also includes a backscattered-particle detector situated and configured to detect backscattered charged particles produced by the location on the substrate as the location is irradiated by the charged particle beam. The device also includes a controller connected to the deflector and the backscattered-particle detector. The controller is configured to: (1) energize the deflector in a manner causing the deflector to irradiate the beam on a first location on the substrate lacking an alignment mark, thereby producing a background backscattered-particle signal; (2) energize the deflector in a manner causing the deflector to irradiate the beam on a second location on the substrate in which an alignment mark is formed, thereby producing an alignment-mark backscattered-particle signal; (3) calculate a difference signal by subtracting the background signal from the alignment-mark signal; and (4) determine the position of the alignment mark from the difference signal.

The present invention can be applied to any type of CPB microlithography, including (but not limited to) CPB direct writing, block exposure, and divided-reticle exposure (involving exposure of individual subfields and stitching of individual subfield images).

The foregoing and additional features and advantages of the invention will be more readily apparent from the following detailed description, which proceeds with reference to the accompanying drawings.

BRIEF DESCRIPTION OF THE DRAWINGS

FIG. 1(A) is a backscattered-electron (BSE) signal waveform obtained when scanning an electron beam over an alignment mark formed on a silicon substrate. FIG. (1B) is a BSE signal waveform obtained when an electron beam is scanned over a smoothly planar region (lacking an alignment mark) of the silicon substrate. FIG. 1(C) is a BSE signal waveform obtained by subtracting the waveform of FIG. 1(B) from the waveform of FIG. 1(A).

FIG. 2(A) depicts a representative electron channeling pattern of "Kikuchi bands" obtained by multiple scans of a 111 silicon substrate in two dimensions using an electron beam. FIG. 2(B) is an exemplary signal waveform obtained by scanning between points B—B of FIG. 2(A).

DETAILED DESCRIPTION

The following discussion is in the context of an electron-beam microlithography apparatus. However, it will be understood that the principles described below can be applied with equal facility to use of other types of charged particle beams, such as an ion beam.

Figure 1A:
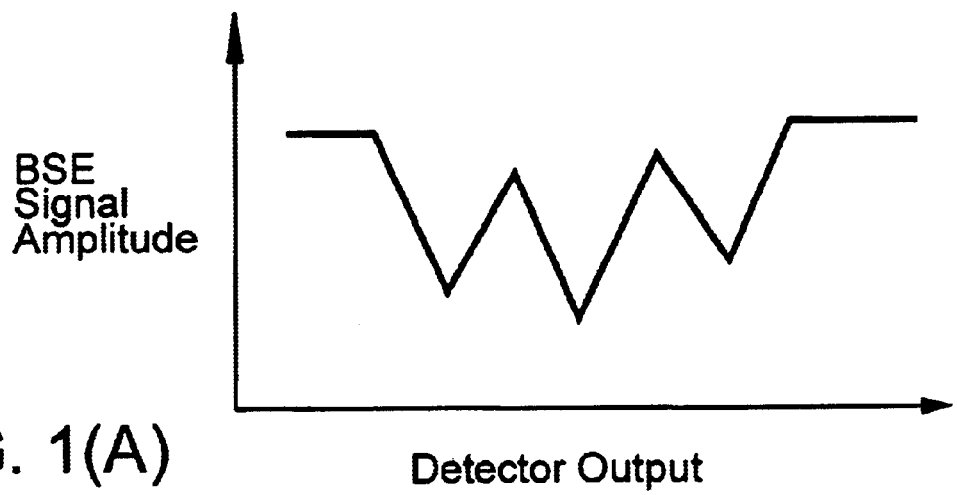
FIGS. 1(A)–1(C) are plots of exemplary backscattered-particle signal waveforms obtained in an alignment-mark-position detection method according to a representative embodiment of the invention.
Figure 1B:
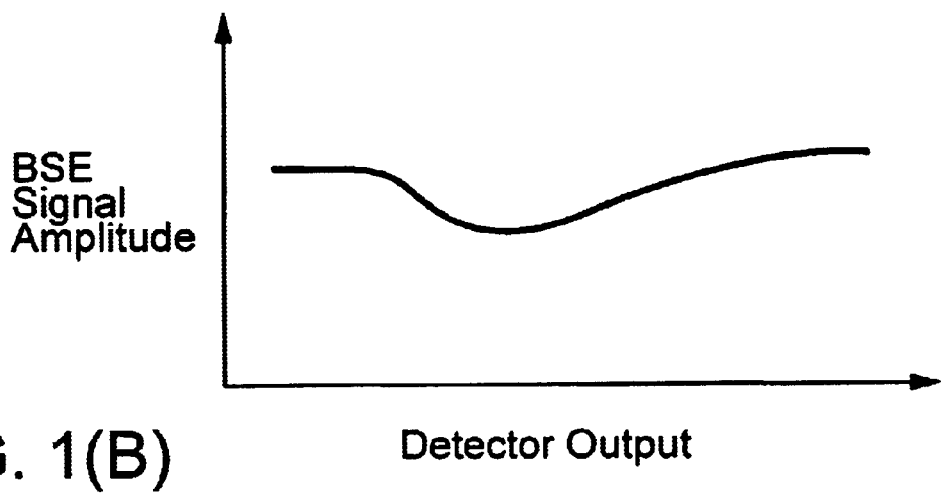
Figure 1C:
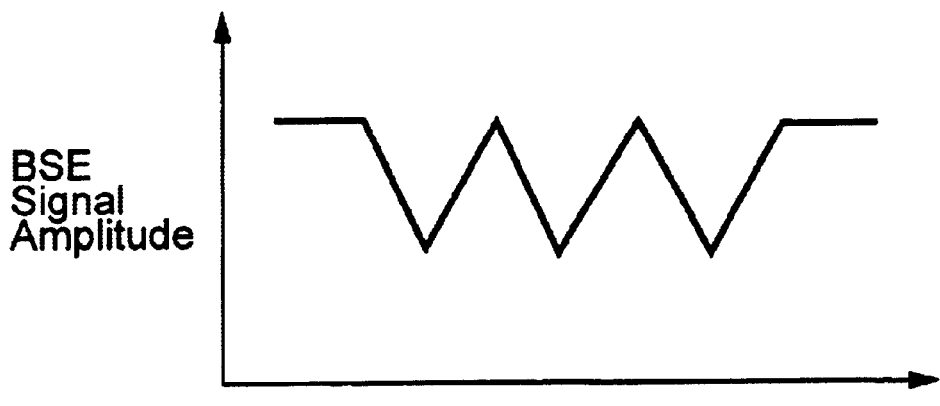

FIGS. 1(A)–1(C) depict exemplary respective backscattered-electron (BSE) signal waveforms obtained using a representative embodiment of an alignment-mark detection method according to the invention. FIG. 1(A) shows a BSE signal waveform obtained by scanning the electron beam over an alignment mark formed on a silicon wafer. FIG. 1(B) shows a BSE signal waveform obtained by scanning the electron beam over a smooth surface of silicon that lacks an alignment mark. The signal waveform shown in FIG. 1(B) includes the effects of electron-beam channeling discussed below with respect to FIG. 2(B). FIG. 1(C) is obtained by subtracting the plot of FIG. 1(B) from the plot of FIG. 1(A).

Figure 2A:
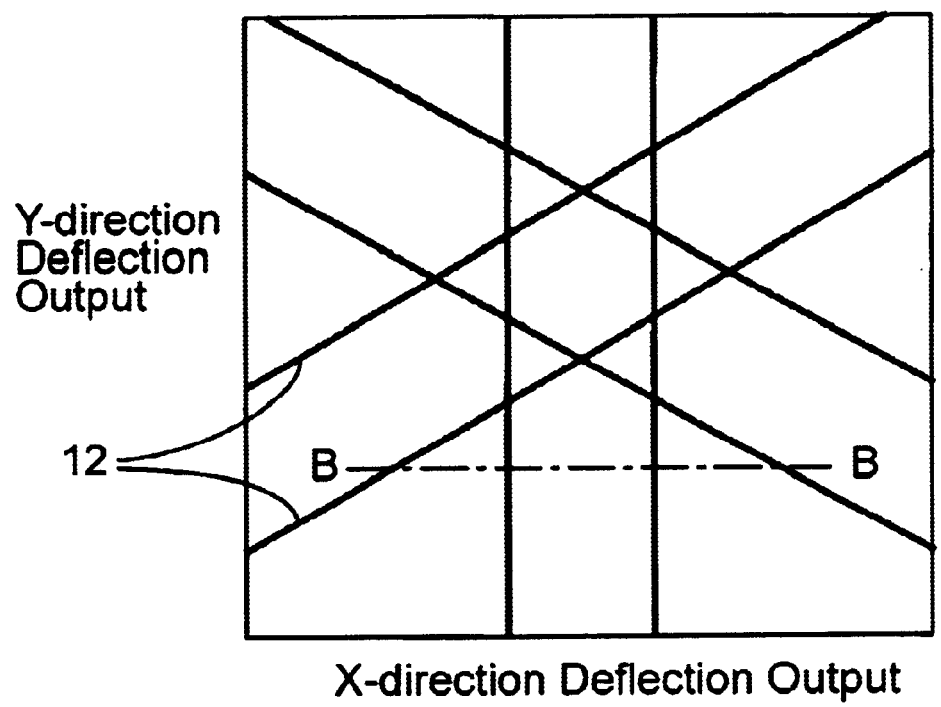
FIGS. 2(A)–2(B) depict exemplary effects, on a backscattered-particle (e.g., BSE) signal, caused by crystalline properties of a monocrystalline silicon substrate.

The specimen used to produce the signal waveforms of FIGS. 1(A)–1(C) is a monocrystalline silicon wafer of which the upstream-facing surface has a lattice orientation of 111. An electron beam, incident on such a specimen, is scanned across the surface in a manner as shown in FIG. 3(A), in which the angle of incidence of the electron beam on the specimen exhibits a slight change with the amount of lateral deflection imparted to the beam by the deflector 3. As the electron beam is scanned across the surface, the BSE detector 9 produces a BSE signal that can be used to produce an "electron channeling pattern" (ECP). A representative ECP for 111 silicon is shown in FIG. 2(A). The BSE signal amplitude for a scan along the line B—B is shown in FIG. 2(B).

More specifically, FIG. 2(A) shows an exemplary profile or map of "Kikuchi bands" 12 produced by scanning a 111 surface of silicon with an electron beam. The scanning is performed over coordinates in the X- and Y-directions. Along each thick line 12 in FIG. 2(A), the BSE signal is reduced, compared to other regions, as a result of interactions of the incident electrons with atoms of the crystalline surface. In FIG. 2(A), the abscissa (horizontal axis) is the X-direction deflection output (to the beam) and the ordinate (vertical axis) is the Y-direction deflection output to the beam. Thus, FIG. 2(A) indicates a map of results of respective summed deflections of the beam in the X-direction and in the Y-direction. A representative BSE signal detected by a BSE detector, of an electron beam scanned along the line B—B of FIG. 2(A), is shown in FIG. 2(B). Hence, as shown in FIG. 2(A), the BSE signal is weaker at certain direct relationships between the X-direction deflection output and the Y-direction deflection output. The Kikuchi lines 12 connecting these points are arranged in a characteristic pattern for 111 silicon.

Figure 2B:
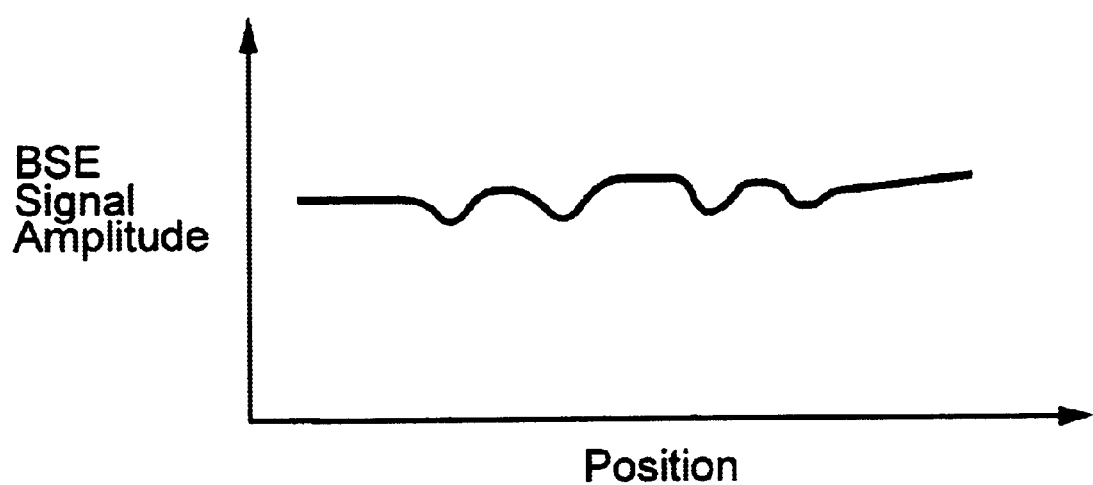
Figure 3A:
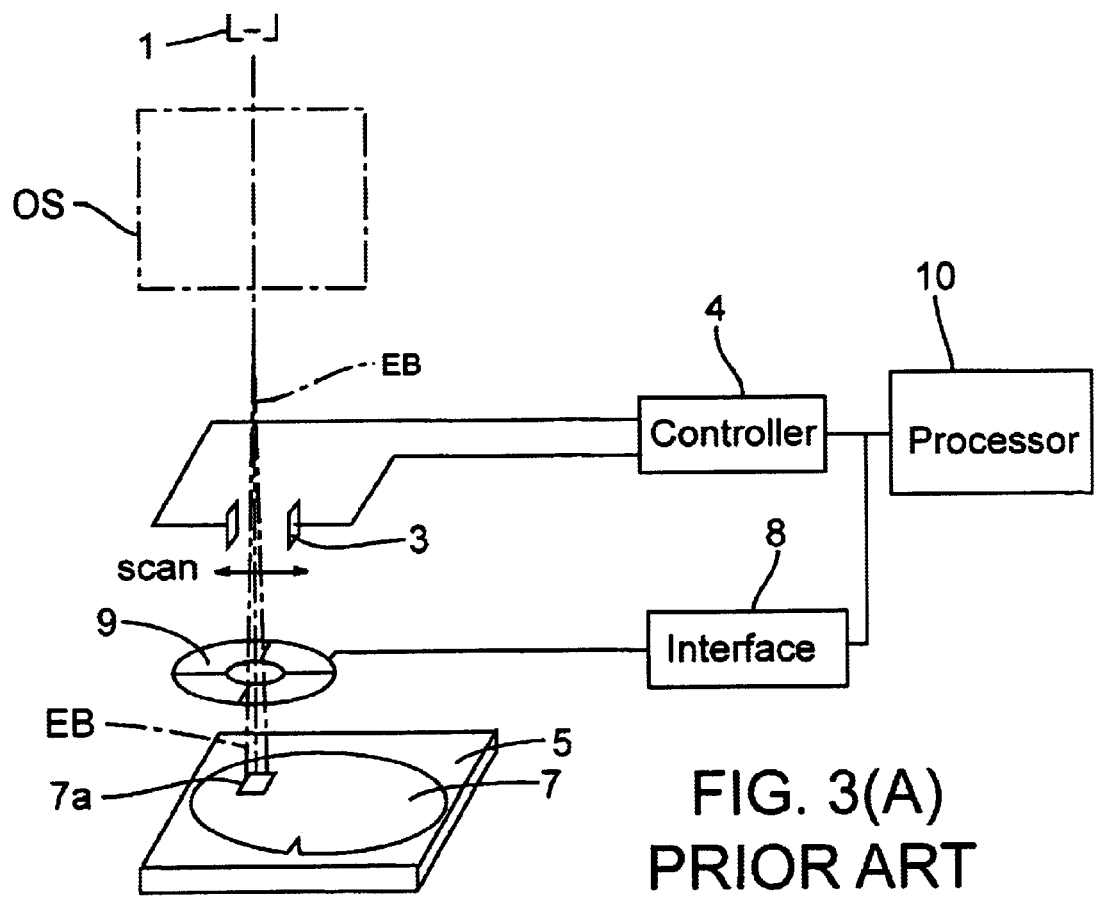
FIG. 3(A) is an oblique schematic depiction of certain details of a conventional device, on a charged-particle-beam (CPB) microlithography apparatus, for scanning the charged particle beam over an alignment mark on a substrate.
Figure 3B:
FIG. 3(B) is a schematic elevational view of an alignment mark being scanned by a charged particle beam.
Figure 3C:
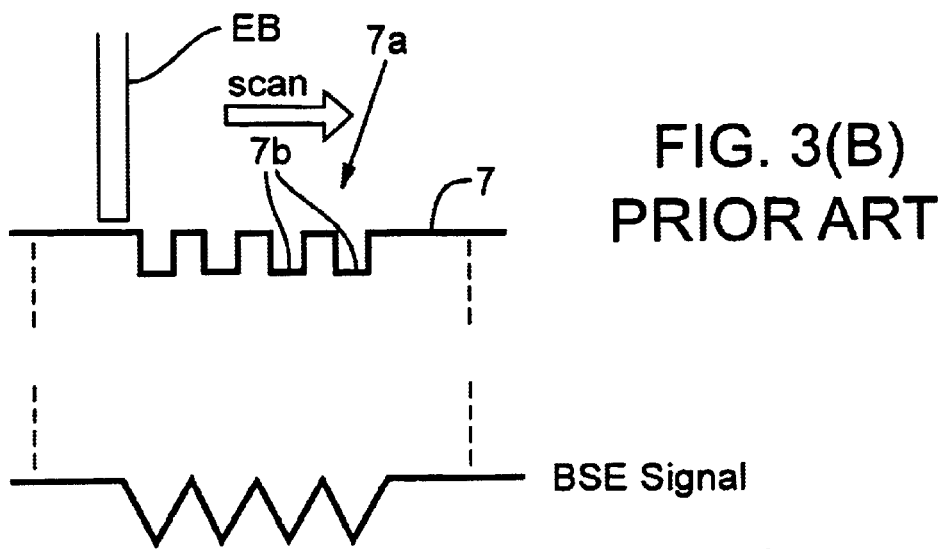
FIG. 3(C) is a representative BSE signal waveform obtained from the scan shown in FIG. 3(B).

FIG. 2(B) is an example BSE signal waveform obtained by scanning the beam in one dimension between the points B—B of FIG. 2(A). FIG. 2(B) shows the characteristic drop of BSE signal amplitude as the scanned beam crosses the Kikuchi lines 12. As noted above, the waveform of FIG. 2(B) exhibits a characteristic change in amplitude corresponding to certain angles of incidence of the electron beam in the X-Y plane. The particular BSE signal waveform shown in FIG. 2(B) reflects characteristics of the crystal lattice of the specimen being scanned. Patterns that are similar are obtained from specimens having identical crystal orientations.

The BSE signal waveform originating from the crystal properties of the specimen can be removed from the signal. For example, a BSE signal waveform such as that of FIG. 1(B) is obtained and stored in a memory. The FIG. -1(B) waveform reflects the crystalline properties of the specimen as manifest on a smooth plane thereof on which the monocrystalline silicon has identical crystalline properties. The FIG. -1(B) waveform is subtracted from the BSE signal waveform of FIG. 1(A) obtained from the alignment mark. The resulting signal, shown in FIG. 1(C), is representative of a signal having a waveform arising only from characteristics of the alignment mark, without obfuscating influences of the material on which the alignment mark is located. Furthermore, when obtaining the waveforms of FIGS. 1(A) and 1(B), the scanning conditions of the electron beam and the inclination of the specimen relative to the electron beam must be the same.

Whenever a resist is coated onto a surface of a silicon substrate, the amplitude of the BSE signal waveform originating from the crystalline properties of the specimen decreases but does not decrease entirely to zero. Therefore, methods according to the invention as described above are effective for improving the detection accuracy of the alignment mark position.

Methods for detecting alignment-mark positions, as described above, can be executed automatically via commands from the controller 10 of the apparatus shown in FIG. 3(A).

Figure 4:
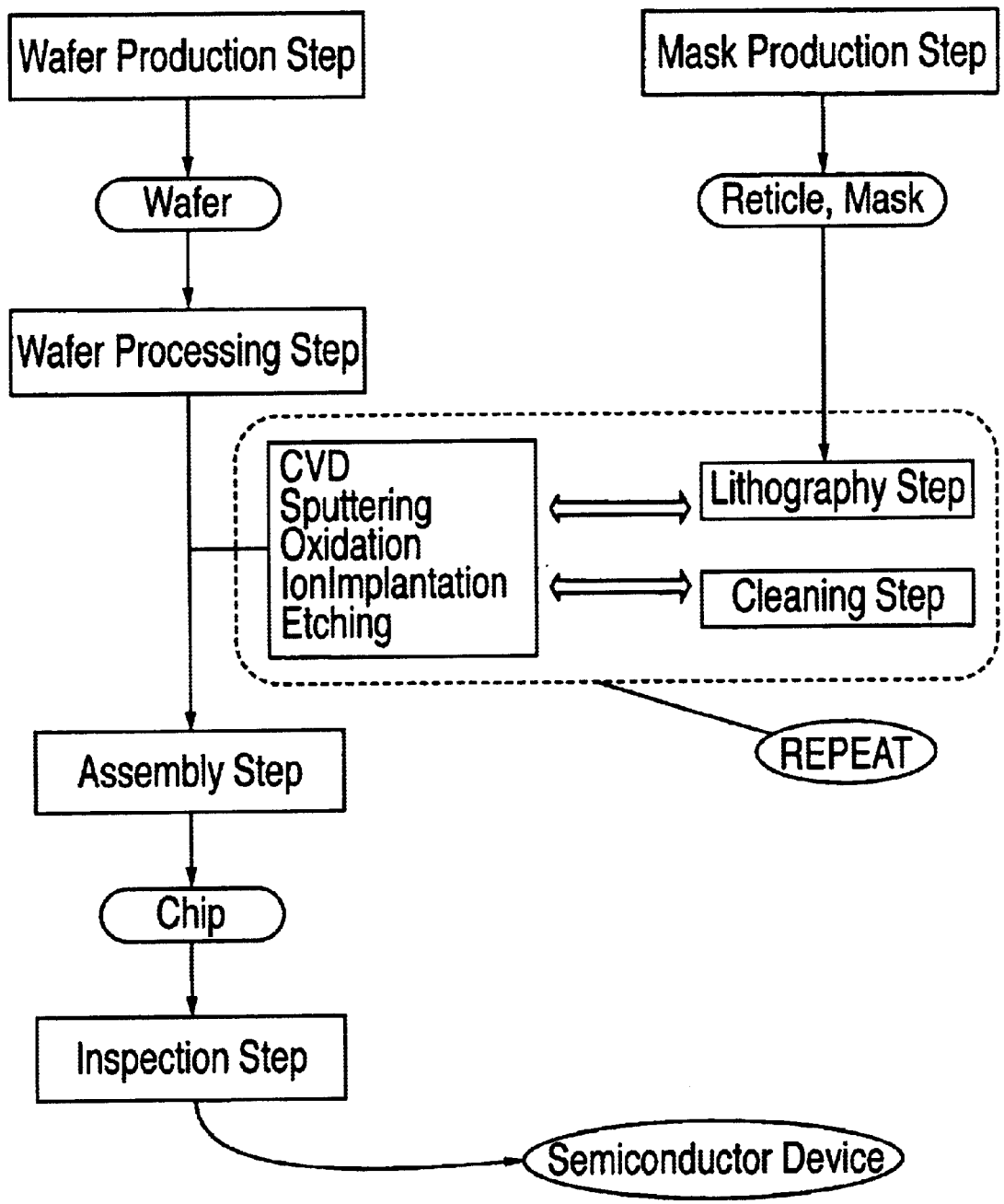
FIG. 4 is a process flowchart for manufacturing a microelectronic device, wherein the process includes a microlithography method according to the invention.

FIG. 4 is a flowchart of an exemplary semiconductor-device fabrication method to which apparatus and methods, according to the invention, for performing a microlithographic exposure including detection of alignment-mark positions readily can be applied. The fabrication method generally comprises the main steps of wafer production (wafer fabrication), reticle production (reticle preparation) for use in microlithography of the wafer, wafer processing, device assembly (including chip dicing and making each chip functional), and chip inspection. Each step usually comprises several sub-steps.

Among the main steps, wafer processing is key to achieving the smallest feature sizes (critical dimensions) and best inter-layer registration. In the wafer-processing step, multiple circuit patterns (such as for memories and/or CPUs) are layered successively atop one another on the wafer, wherein the formation of each layer typically involves multiple sub-steps. Usually, many operative semiconductor devices are produced on each wafer.

Typical wafer-processing steps include: (1) thin-film formation (by, e.g., CVD or sputtering) to form a dielectric layer for electrical insulation or a metal layer a, for connecting wires or forming electrodes; (2) oxidation the thin film or substrate surface; (3) microlithography to form a resist pattern for selective processing of the thin film or the substrate itself; (4) etching or analogous step (e.g., anisotropic dry etching) to etch the thin film or substrate according to the resist pattern; (5) doping or other implantation step as required to implant ions or other impurities into the thin film or wafer; (6) resist stripping to remove the resist from the wafer; and (7) chip inspection. Wafer processing is repeated as required (typically many times) to fabricate the desired semiconductor chips on the wafer.

Figure 5:
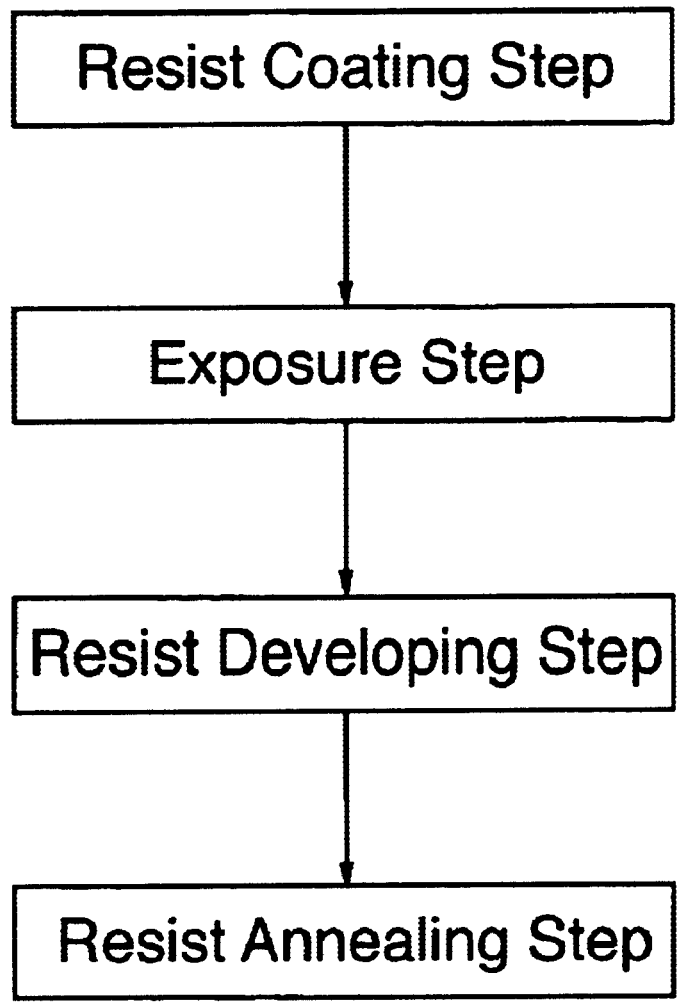
FIG. 5 is a process flowchart of certain aspects of a microlithography method as used in the process of FIG. 4.

FIG. 5 provides a flowchart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step); (2) exposure step, to expose the resist with the desired pattern; (3) development step, to develop the exposed resist; and (4) optional annealing step, to stabilized or enhance the durability of the resist pattern.

Use of the alignment-mark-position detection method described above results in a microlithography process having improved accuracy, especially microlithography processes directed to achieving very fine linewidths. This is because methods according to the invention provide greater accuracy in alignment-mark detection. Greater detection accuracy is achieved especially whenever the subject alignment mark is present on a substrate having pronounced crystalline properties, such as monocrystalline silicon, and the mark is being scanned with a beam having a relatively high energy level such as 100 keV.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a method for performing charged-particle-beam (CPB) microlithography of a specimen of which a surface has a crystal-lattice orientation, and an alignment mark is formed on the surface, a method for detecting a position of the alignment mark, comprising:

irradiating a charged particle beam onto an area of the specimen surface having the crystal-lattice orientation but at which the alignment mark is not present, and detecting backscattered charged particles propagating from the irradiated area, so as to obtain a first backscattered-particle signal;

storing data in the first backscattered-particle signal in a memory;

irradiating the charged particle beam onto the alignment mark, and detecting backscatter charged particles propagating from the irradiated alignment mark, so as to obtain a second backscattered-particle signal;

recalling in the stored data from the memory and subtracting the recalled data from the second backscattered-particle signal to obtain a difference signal; and determining the alignment-mark position from the difference signal.

2. The method of claim 1, wherein the step of irradiating a charged particle beam onto an area of the specimen surface at which the alignment mark is not present is performed by scanning the charged particle beam across a smooth planar region of the surface of the specimen.

3. The method of claim 1, wherein:

the first backscattered-particle signal is obtained by scanning the charged particle beam across a smooth planar region of the surface of the specimen that represents the crystal-orientation plane, and in the step of subtracting the first backscattered-particle signal from the second backscattered-particle signal to obtain a difference signal, the subtraction removes data, concerning the crystal-orientation plane, from the difference signal that otherwise would obfuscate data in the difference signal pertaining to the alignment mark.

4. The method of claim 3, wherein:

the first backscattered-particle signal is further obtained by changing an angle of incidence of the charged particle beam as the beam is scanned across the smooth planar region of the surface; and a waveform of the first backscattered-particle signal exhibits a change in amplitude with corresponding changes in the angle of incidence.

5. A method for performing charged-particle-beam (CPB) microlithography of a specimen, comprising:

mounting the specimen on a substrate stage;

detecting a position of an alignment mark on the specimen using a method as recited in claim 1; and microlithographically exposing a pattern onto the substrate.

6. A microelectronic-device fabrication process, comprising the steps:

(a) preparing a wafer specimen;

(b) processing the wafer specimen;

(c) assembling devices formed on the wafer specimen during steps (a) and (b), wherein step (b) comprises a method for performing CPB microlithography as recited in claim 5.

7. The method of claim 1, wherein the first backscattered-particle signal includes data produced by scanning the charged particle beam across one or more Kikuchi lines on the surface.

8. In a charged-particle-beam (CPB) microlithography apparatus including a CPB source that produces a charged particle beam, a CPB-optical system through which the charged particle beam passes from the CPB source to a substrate of which a surface has a crystal-lattice orientation and includes an alignment mark formed on the surface, and a substrate stage on which the substrate is placed for exposure by the charged particle beam, a device for measuring an alignment of the substrate, the device comprising:

a deflector situated and configured to deflect the charged particle beam to cause the beam to irradiate a predetermined location on the surface of the substrate mounted on the substrate stage, so as to cause the location to produce backscattered particles;

a backscattered-particle detector situated and configured to detect backscattered charged particles produced by the location on the substrate as the location is irradiated by the charged particle beam;

a controller connected to the deflector and the backscattered-particle detector, the controller being configured to (i) energize the deflector in a manner causing the deflector to irradiate the beam on a first location on the surface lacking an alignment mark, thereby producing a background backscattered-particle signal including data generated by backscatter from features associated with the crystal-lattice orientation; (ii) energize the deflector in a manner causing the deflector to irradiate the beam on the alignment mark, thereby producing an alignment-mark backscattered-particle signal; (iii) calculate a difference signal by subtracting the background signal from the alignment-mark signal; and (iv) determine the position of the alignment mark from the difference signal.

9. A CPB microlithography apparatus, comprising a device for measuring substrate alignment as recited in claim 8.

10. A microelectronic-device fabrication process, comprising the steps:

(a) preparing a wafer substrate;

(b) processing the wafer substrate;

(c) assembling devices formed on the wafer substrate during steps (a) and (b), wherein step (b) comprises the steps of (i) applying a resist to the wafer substrate;

(ii) microlithographically exposing the resist; and (iii) developing the resist; and step (ii) comprises providing a CPB microlithography apparatus as recited in claim 9; and using the CPB microlithography apparatus to expose the resist with a pattern.

* * * * *

UNITED STATES PATENT AND TRADEMARK OFFICE
CERTIFICATE OF CORRECTION

PATENT NO. : 6,841,402 B1
DATED : January 11, 2005
INVENTOR(S) : Hirayanagi

It is certified that error appears in the above-identified patent and that said Letters Patent is hereby corrected as shown below:

Column 4,
Line 13, "FIG. (1B)" should be -- FIG. 1(B) --.

Column 5,
Lines 43 and 47, "FIG. -1(B)" should be -- FIG.-1(B) --

Column 6,
Line 22, "layer a, for" should be -- layer for --.
Line 23, "(2) oxidation the" should be -- (2) oxidation of the --.
Line 42, "to stabilized or" should be -- to stabilize or --

Signed and Sealed this

Twenty-sixth Day of April, 2005

JON W. DUDAS
*Director of the United States Patent and Trademark Office*